United States Patent [19]
Roth et al.

[11] Patent Number: 5,210,435
[45] Date of Patent: May 11, 1993

[54] ITLDD TRANSISTOR HAVING A VARIABLE WORK FUNCTION

[75] Inventors: Scott S. Roth; Carlos A. Mazure; Kent J. Cooper; Wayne J. Ray; Michael P. Woo; Jung-Hui Lin, all of Austin, Tex.

[73] Assignee: Motorola, Inc., Schaumburg, Ill.

[21] Appl. No.: 745,652

[22] Filed: Aug. 16, 1991

Related U.S. Application Data

[62] Division of Ser. No. 597,946, Oct. 12, 1990, Pat. No. 5,061,647.

[51] Int. Cl.$^5$ .................. H01L 29/76; H01L 29/94; H01L 31/062
[52] U.S. Cl. .................. 257/344; 257/408; 257/412; 257/413
[58] Field of Search .................. 357/23.3, 23.9, 71, 357/23.4; 437/40, 44; 257/344, 408, 412, 413

[56] References Cited

U.S. PATENT DOCUMENTS

| | | | |
|---|---|---|---|
| 4,963,504 | 10/1990 | Huang | 437/44 |
| 4,971,922 | 1/1990 | Watabe et al. | 357/23.3 |
| 5,015,599 | 5/1991 | Verhaar | 357/23.3 |
| 5,053,849 | 10/1991 | Izawa et al. | 437/44 |
| 5,061,647 | 10/1991 | Roth et al. | 357/23.9 |

FOREIGN PATENT DOCUMENTS

| | | | |
|---|---|---|---|
| 58-200576 | 11/1983 | Japan | 437/44 |
| 1-125977 | 5/1989 | Japan | 357/23.3 |
| 1-232765 | 9/1989 | Japan | 357/23.3 |
| 2-35777 | 2/1990 | Japan | 357/23.3 |
| 2-262340 | 10/1990 | Japan | 437/44 |
| 2-268441 | 11/1990 | Japan | 437/44 |

OTHER PUBLICATIONS

IEEE Electron Device Letters, vol. EDL-8, No. 4, Apr. 1987, "A new LDD transistor with Inverse T-Gate Structure", pp. 151-153.

*Primary Examiner*—Rolf Hille
*Assistant Examiner*—Steven Loke
*Attorney, Agent, or Firm*—Jasper W. Dockrey

[57] ABSTRACT

A semiconductor device and process wherein an ITLDD device (60) is formed having an inverse-T (IT) transistor gate with a variable work function ($\Phi$) across the gate. The variable work function is attained by depositing a work function adjusting layer onto the thin gate extensions of the IT-gate. In accordance with one embodiment of the invention, a semiconductor substrate (10) of a first conductivity type is provided having a gate dielectric layer (12) formed thereon. First and second lightly doped regions (36, 37) of a second conductivity type are formed in the substrate which are spaced apart by a channel region (38). An IT-gate electrode (48) is formed on the gate dielectric layer overlying the first and second lightly doped regions and the channel region. The IT-gate has a relatively thick central section (32) and relatively thin lateral extensions (50) projecting from the central portion along the gate dielectric layer. A work function adjusting layer (46) overlies and is in intimate contact with at least the lateral extensions of the IT-gate. The presence of the work function adjusting layer changes the electrical characteristics of the extensions relative to the central section of the IT-gate. Heavily doped source and drain regions (52, 53) of the second conductivity type are formed in the substrate adjacent to the first and second lightly doped regions and aligned to the edge of the gate extensions.

7 Claims, 3 Drawing Sheets

ITLDD TRANSISTOR HAVING A VARIABLE WORK FUNCTION

This is a division of application Ser. No. 07/597,946, filed Oct. 12, 1990, now U.S. Pat. No. 5,061,647.

FIELD OF THE INVENTION

This invention relates in general to semiconductor devices, and more particularly to a semiconductor device having inverse-T-lightly-doped-drain (ITLDD) transistors therein and to methods for its fabrication.

BACKGROUND OF THE INVENTION

A major problem hindering the further size reduction of metal-oxide-semiconductor (MOS) transistor devices is the loss of performance which is characteristic of transistors having channel lengths less than about 0.8 micron. The performance degradation includes but is not limited to low source-drain breakdown voltage, subthreshold leakage, increased junction capacitance and threshold voltage instability. These problems, known collectively as short channel effects, are related to the electrodynamics of the transistor channel during operation. In the scaling of transistor dimensions to smaller values, an attempt is made to adjust the electric field in the channel such that the peak lateral electric field of the drain depletion region is minimized. A widely used technique to reduce the peak lateral field and minimize short channel effects is to fabricate a lightly-doped drain (LDD) structure.

In an N-channel device, a conventional LDD structure comprises an N− region in proximity to the transistor channel and an N+ region displaced away from the channel by the width of the N− region. As the length of the transistor channel is reduced, transistors fabricated using a conventional LDD structure show increased substrate current (ISUB) and lower breakdown voltages (BVDSS). A reduction of the dopant concentration in the N− region improves ISUB and BVDSS however, other parameters such as threshold voltage stability and drive current are degraded because impact ionization and series resistance both increase. The limitations of the conventional LDD structure in preventing performance degradation due to short channel effects in 0.5 micron transistors led to the development of the ITLDD transistor (see for example, T. W. Huang, et al., IEDM Tech. Digest, 1986, p. 742). The ITLDD structure includes a transistor gate having a thin gate extension adjacent to a thick central portion. The gate extension overlaps the N− region and brings the N− region directly within the electric field of the gate. A low series resistance is maintained and hence a high drive current is obtained because the gate extension can effectively accumulate majority charge carriers in the underlying N− region.

While overcoming many of the performance problems in submicron MOS transistors, the ITLDD gate is difficult to fabricate to sub-micron dimensions and short channel effects persist. The short channel effects, particularly threshold voltage instability, are most severe in the case of P-channel devices where the gate is of N-type conductivity. In a CMOS device, the channel region in P-type MOS transistors is typically counter doped to adjust the threshold voltage to slightly lower absolute value. The counter doping results in an active channel region that is well below the substrate surface where lateral drain field encroachment into the channel region is problematic even though an LDD structure has been formed. A transistor having a channel region displaced from the surface of the substrate is known as a "buried channel" device. Lateral drain field encroachment in the buried channel can be reduced, and thus short channel effects minimized, if the energy levels within the gate, represented by the work function potential difference across the gate dielectric ($\Phi$), can be adjusted along the length of the ITLDD gate itself.

BRIEF SUMMARY OF THE INVENTION

In practicing the present invention there is provided a semiconductor device and process wherein an ITLDD structure is formed having an inverse-T (IT) transistor gate with a variable work function ($\Phi$) across the gate. The variable work function is attained by depositing a work function adjusting layer onto the thin gate extensions of the IT-gate. In accordance with one embodiment of the invention, a semiconductor substrate of a first conductivity type is provided having a gate dielectric layer formed thereon. First and second lightly doped regions of a second conductivity type are formed in the substrate which are spaced apart by a channel region. An IT-gate electrode is formed on the gate dielectric layer overlying the first and second lightly doped regions and the channel region. The IT-gate has a relatively thick central section and relatively thin lateral extensions projecting from the central portion along the gate dielectric layer. A work function adjusting layer overlies and is in intimate contact with at least the gate extensions of the IT-gate. The presence of the work function adjusting layer changes the electrical characteristics of the extensions relative to the central section of the IT-gate. Heavily doped source and drain regions of the second conductivity type are formed in the substrate adjacent to the first and second lightly doped regions and are aligned to the edge of the gate extensions.

A process is provided for fabricating the device wherein the IT-gate is formed by a non-photolithographically limited etching technique. The etch technique includes the formation of a composite hardmask having a first layer overlying a second layer wherein the width of the composite mask is determined by the width of the first layer. During the formation of the first layer, an etch process is used which undercuts an overlying resist pattern to reduce the width of the fist layer to a dimension below that obtainable with conventional photolithography. The hardmask is then used to define the width of the central section of the IT-gate. In this manner ITLDD devices can be realized having sub-micron channel lengths while not requiring sub-micron photolithography process capability.

Figure 1:
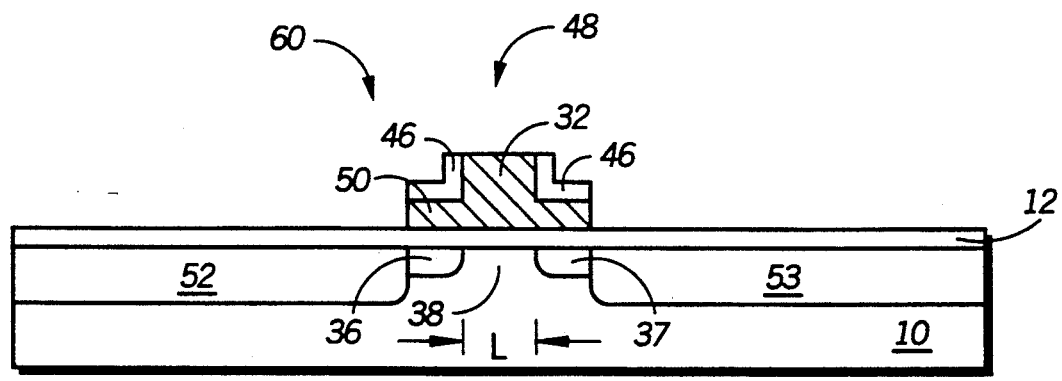
FIG. 1, illustrates, in cross section, an ITLDD transistor formed in accordance with the invention.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF A PREFERRED EMBODIMENT

Shown in FIG. 1, in cross section, is an inverse-T-lightly-doped-drain (ITLDD) transistor 60 fabricated within a semiconductor substrate region 10 of a first conductivity type. A gate dielectric layer 12 overlies substrate region 10 and supports an inverse-T (IT) gate 48. Lightly doped source and drain regions 36 and 37 are formed in substrate region 10 and spaced apart by an intermediate channel region 38 having a length L. IT-gate 48 includes a relatively thick central section 32 and a relatively thin lateral extension 50 projecting from the sides of central section 32 along gate dielectric layer 12. A $\Phi$ adjust layer 46, comprised of a work function adjusting material, overlies lateral extension 50 and the sides of central section 32. Heavily doped source and drain regions 52 and 53 are formed in substrate region 10 adjacent to lightly doped regions 36 and 37 and aligned to the edges of lateral extension 50.

For purposes of illustration only, it will be understood that substrate region 10 is monocrystalline silicon, that the body of IT-gate 48 is polycrystalline silicon, and that gate dielectric 12 is silicon oxide. Other suitable materials can be used for these elements and the device would have a structure and function similar in kind to that of the present invention. For example, the IT-gate can be amorphous silicon and the gate dielectric can incorporate silicon nitride.

The structure illustrated in FIG. 1, in accordance with the invention, has the advantage of having $\Phi$ adjusted region of the IT-gate overlying the lightly doped portion of the LDD drain structure. An important factor that influences both the effective gate length ($L_{eff}$) and the magnitude of the threshold voltage ($V_t$) in an MOS transistor is the work function $\Phi$ which represents the energy required to move a charge across the energy barrier from the gate electrode to the channel. The work function is determined by the difference between the Fermi energy level of the gate electrode and that of the channel material. In addition to the intrinsic energy characteristics, the magnitude of $\Phi$ is influenced by the relative conductivity type of the dopant introduced to the gate and the channel material. For example, relative to an intrinsic energy level, introducing a donor, or N-type, atom increases the Fermi energy level above that of the intrinsic energy level, conversely, introducing an acceptor, or P-type, atom decreases the Fermi energy level relative to the intrinsic energy level. In a given MOS device $V_t$ is in part given by the magnitude of $\Phi$ which in turn is influenced by the relative doping level and conductivity of the gate and the substrate.

In one embodiment, $\Phi$ adjust layer 46 is a refractory metal such as titanium, molybdenum, tungsten, cobalt and the like which is reacted with the material comprising lateral extension 50 to form a refractory metal silicide. The presence of a refractory metal overlying and in intimate contact with lateral extension 50 imparts metallic electrical characteristics to that portion of IT-gate 48 and lowers the electron energy levels specifically within that portion of the gate. The fabrication of an IT-gate having localized regions with predetermined energy levels enables the performance characteristics of the ITLDD transistor to be optimized. This is possible because, as $\Phi$ is attenuated along the length of the IT-gate several parameters including the flat-band voltage ($V_{FB}$) and the $V_t$ change in response to the variation in $\Phi$.

In an illustrative example to which the invention is not limited, the semiconductor material of IT-gate 48, including central section 32 and lateral extension 50, is doped with a P-type impurity, substrate region 10 is N-type and lateral extension 50 is given N-type characteristics by an overlying refractory metal silicide. In this case the work function between the lateral extension 50 and the substrate will be less than the work function between central section 32 and channel region 38. The small $\Phi$ value in a portion of IT-gate 48 localized to lateral extension 50 enables the inversion of the substrate region immediately underlying lateral extension 50. The presence of the inversion layer near the surface of the substrate redirects channel region 38 to the substrate surface underlying lateral extension 50 where lightly doped regions 36 and 37 actively minimize the lateral drain electric field. The portion of channel region 38 directly underlying central section 32 remains well below the substrate surface where carrier mobility is high. Further, the close proximity of channel region 32 to lateral extension 50 results in improved charge control by IT-gate 48. The enhanced control of the lateral drain electric field prevents the effective electrical channel length ($L_{eff}$) from being foreshortened by the drain field. The "effective" $V_t$ of the entire device becomes less dependent on L; therefore, short channel effects are reduced as a result of the increased stability of $V_t$.

The inventive structure can also be advantageously used to improve device reliability in the case where an inverse conductivity relationship of the gate material exists to that described above; namely, where the substrate is again P-type but IT-gate central section 32 is N-type and lateral extension 50 is P-type. Lateral extension 50 is made P-type when, for example, $\Phi$ adjust layer 46 is P-doped polysilicon and the P-type dopant is diffused from the $\Phi$ adjust layer into the lateral extension. In this case the portion of channel region 38 underlying lateral extension 50 is pushed away from the substrate surface and the portion underlying central section 32 is drawn close to the surface of the substrate. The common polarity between lateral extension 50 of IT-gate 48 and channel region 38 repels the positive carriers in the channel region away from the gate extension, whereas the opposite polarity between central section 32 of IT-gate 48 and channel region 38 attracts the positive carriers in channel region 38 to the lateral extensions. This channel configuration reduces hot carrier injection into the gate oxide resulting in a stable $V_t$ over long periods of time.

Figure 2:
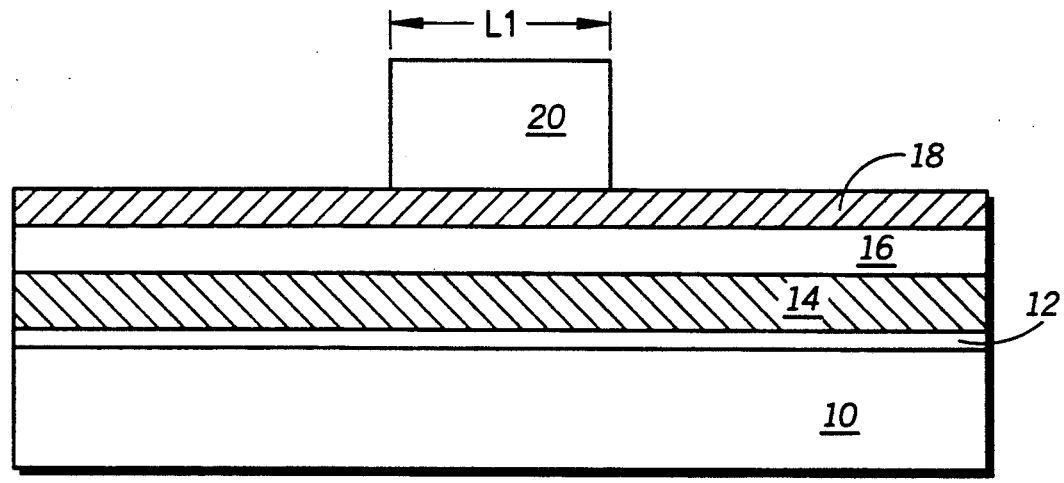
FIGS. 2-9 illustrate, in cross section, process steps in accordance with the invention.

One embodiment of a process used to fabricate ITLDD transistor 60 is shown in FIGS. 2-9. Similar reference numbers to those used in FIG. 1 will be employed for clarity. Shown in FIG. 2, in cross section, is a portion of a semiconductor device having already undergone process steps in accordance with the invention. Included in FIG. 2 is a region 10 of a semiconductor substrate of a first conductivity type having a gate dielectric layer 12 thereon. On gate dielectric 12 are sequentially deposited a first conductive layer 14 of a second conductivity type, a buffer layer 16 and a second conductive layer 18. Preferably, first conductive layer 14 is polysilicon deposited to a thickness of about 200 to 400 nanometers and doped with either an N or P type dopant. This impurity will dope what is ultimately to become the conductive gate of ITLDD transistor 60. The conductivity of first conductive layer 14 is selected dependent upon the conductivity of substrate region 10.

For example, in the case of a N-channel transistor substrate 10 is P-type and first conductive layer 14 is N-type. Gate dielectric layer 12 is preferably silicon oxide having a thickness of about 7 to 25 nanometers. Alternatively, other materials can be used; for example, gate dielectric layer can be a composite dielectric comprised of silicon oxide, silicon nitride, or an oxynitride layer, and first conductive layer 14 can be amorphous silicon. Buffer layer 16 can be any material which is differentially etchable with respect to first and second conductive layers 14 and 18. The thickness of buffer layer 16 is dependent upon factors such as the etch selectivity of subsequent etch processes and the particular material used. Preferably, buffer layer 16 is silicon oxide deposited from a tetraethoxysilane (TEOS) source gas to a thickness of about 200 to 300 nanometers; however, other materials can be used such as low temperature silicon oxide (LTO), silicon nitride, oxynitride and the like. Second conductive layer 18 is preferably undoped polysilicon deposited to a thickness of about 100 to 200 nanometers. A resist pattern 20 is photolithographically formed on second conductive layer 18 having a width L1.

Figure 3:
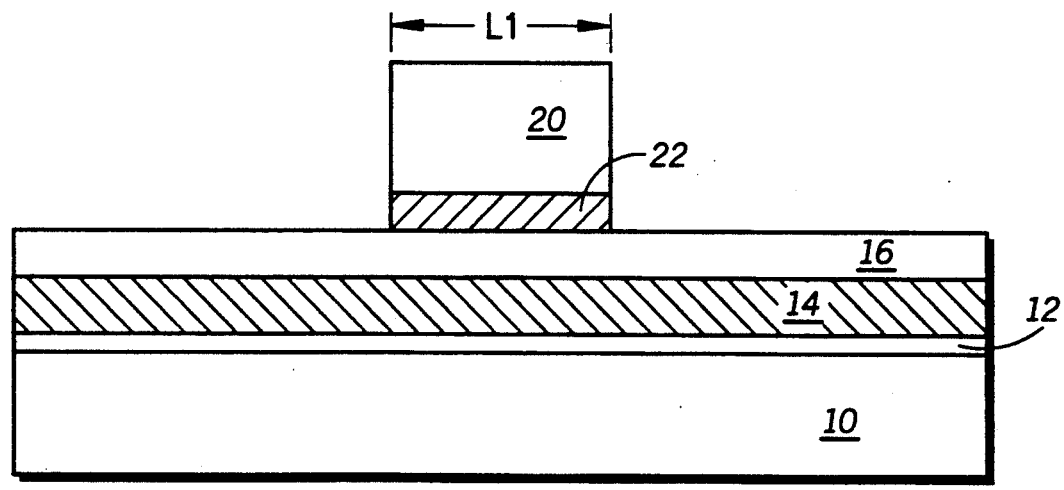

The process continues, as illustrated in FIG. 3, by anisotropically etching second conductive layer 18 using resist pattern 20 as an etch mask to form a portion 22. Portion 22 is coextensive with resist pattern 20 and also has a width L1. Anisotropic etching is an etch process usually carried out in a reactive-ion-etch (RIE) reactor using a combination of etch gases, and reactor conditions, which result in more rapid etching of a material in the vertical direction than the horizontal direction. The directionality of the anisotropic RIE process results in the formation of structures having substantially vertical walls. Additionally, etch gases are chosen which will react with the material comprising second conductive layer 18 much more rapidly than underlying buffer layer 16. The etch rate differential between second conductive layer 18 and buffer layer 16 is defined as the selectivity of the etch. Buffer layer 16 is differentially etchable with respect to second conductive layer 18 in that the etch selectivity between the two layers is substantially greater than one.

Figure 4:
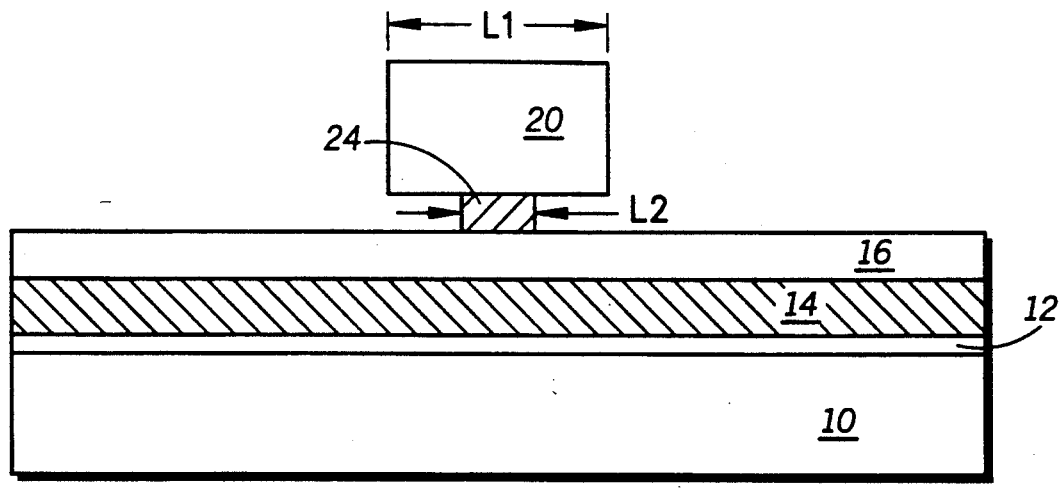

Following the formation of portion 22, a controlled isotropic etch is performed to undercut resist pattern 20 and reduce the width of portion 22, as illustrated in FIG. 4. The isotropic etch is non-directional and proceeds in all directions at the same rate. The isotropic etch reduces the lateral dimension of portion 22 forming a narrow segment 24 underlying mask pattern 20 having a width L2. The isotropic etch conditions are selected to undercut resist pattern 20 by a predetermined amount, L1−L2. The isotropic etch removes the same amount of material equally on both sides of portion 22 resulting in the formation of segment 24 underlying a central portion of resist mask 20.

The isotropic etch is preferably performed in a down-stream etching system wherein gaseous ionized and neutral species are generated in a remote electric field and then transported to an etch chamber containing substrate 10. In the etch chamber, activated ions and neutral species react with portion 22 underlying resist pattern 20 from the periphery of portion 22 resulting in lateral etching action. Preferably, chlorinated and fluorinated source gases are used in the down-stream etch system to etch portion 22 selectively to buffer layer 18. Second conductive layer 22 is preferably formed from a material that can be uniformly etched in a down-stream etching system, such as undoped polysilicon. Segment 24 is formed with substantially vertical sidewalls in part because of the granular crystalline structure and uniform etch characteristics of the undoped polysilicon. Alternatively, a field generated direct plasma etch apparatus, or alternatively, a conventional wet chemical etch can be used to isotropically etch portion 22.

Figure 5:
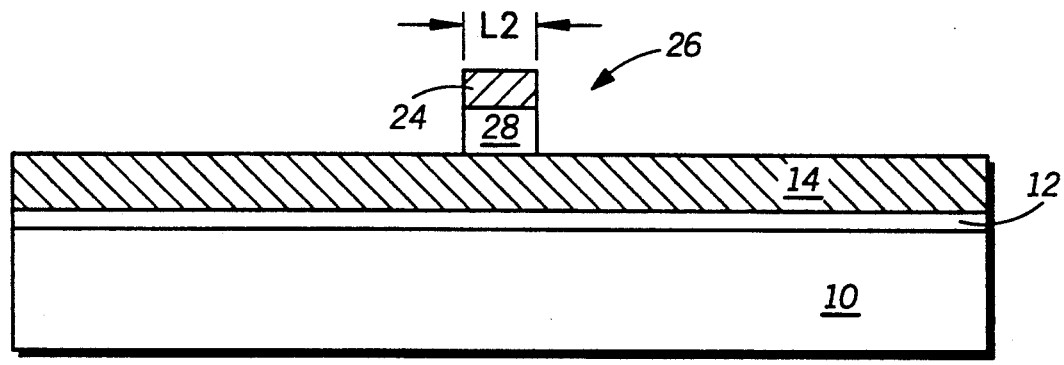

Once segment 24 is formed, resist mask 20 is removed and buffer layer 16 is anisotropically etched to form a composite hardmask 26 overlying first conductive layer 14, as illustrated in FIG. 5. Hardmask 26 is a composite structure formed by anisotropically etching buffer layer 16 to form a buffer portion 28 using segment 24 as an etch mask. As a result of the anisotropic etch, hardmask 26 also has width L2. As can be understood by comparing FIG. 1 with FIG. 4, the undercut etch used to form section 24 has resulted in the formation of hardmask 26 having a width L2 which is less than that of resist pattern 20 by an amount equal to the difference between L1 and L2. This dimensional difference, or bias, enables the formation of a hardmask having a lateral dimension substantially less than resist pattern 20. The lateral dimension of hardmask 26 is therefore not limited by the ability to photolithographically define a structure having a given lateral dimension. The final width of hardmask 26 is determined by both the initial width of photolithographically produced mask pattern 20 and the amount of material removed during the lateral etching of portion 22.

Figure 6:
Figure 6:
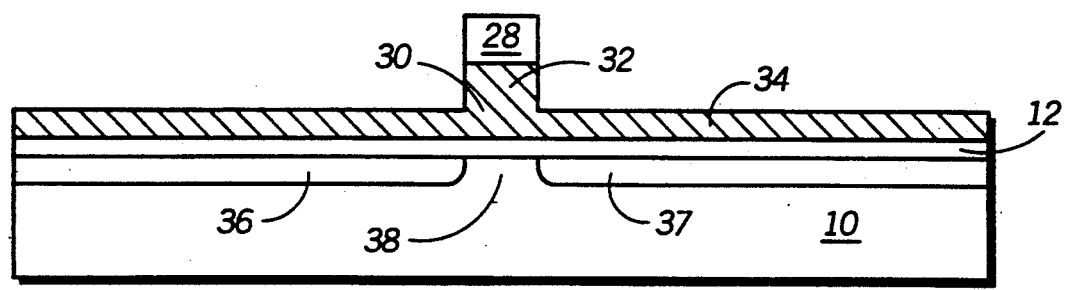

In accordance with the invention, after hardmask 26 is formed, first conductive layer 14 is partially etched, as shown in FIG. 6. During the partial etch, segment 24 is completely etched away exposing remaining buffer portion 28. The removal of segment 24 is used to signal the etching apparatus to stop etching first conductive layer 14. An end point detection system is directed to monitor the removal of segment 24 overlying remaining portion 28. In one embodiment of the invention, a laser beam is directed to a peripheral area of substrate region 10 having substantially the same structure as composite mask 26. The reflection of the laser from the peripheral structure is monitored during the etch and the etch is terminated when the amplitude of the reflected laser beam diminishes indicating the removal of the overlying layer.

Upon removal of section 24 and termination of the etch, first conductive layer 14 has been partially etched to form a conductive body 30 having a relatively thick central section 32 underlying buffer portion 28 and a relatively thin peripheral layer 34 extending laterally from central section 32 along gate dielectric layer 12. Lightly doped regions 36 and 37 of a second conductivity type are then formed in substrate region 10 using central section 32 as a doping mask. Preferably, lightly doped regions 36 and 37 are formed by ion implanting conductivity determining atoms into substrate 10 through peripheral layer 34. The ion implant forms lightly doped regions 36 and 37 in substrate 10 which are self-aligned to central section 32. Lightly doped regions 36 and 37 are spaced apart by a channel region 38 underlying central section 32. It should be noted that channel region 38 has a length L which is approximately equivalent to the width L1 of central section 32. Of course it is recognized that a certain amount of lateral dopant diffusion can occur during thermal cycles normally used in the fabrication of semiconductor devices, and that lateral dopant diffusion can reduce L to a dimension slightly less than L1.

Figure 7:
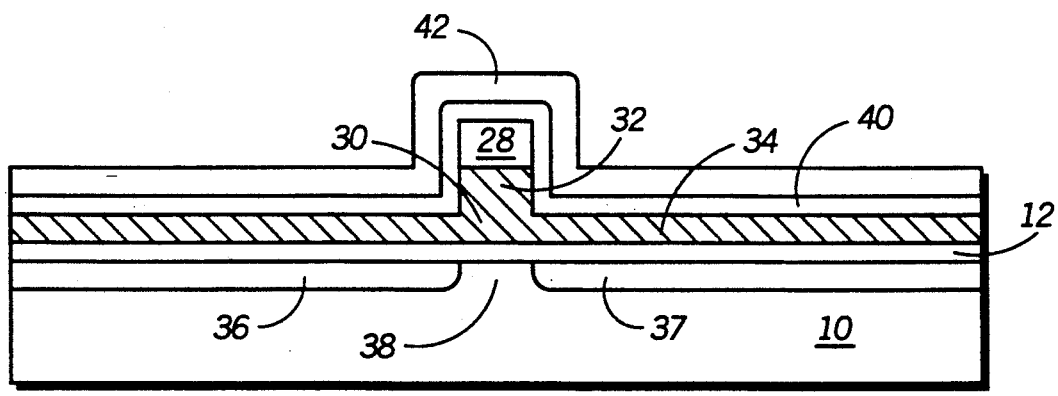

Next, a layer 40 of work function adjusting material is conformably deposited to overlie substrate region 10, as shown in FIG. 7. Layer layer 40 is preferably a refractory metal such as titanium, molybdenum, tungsten, cobalt and the like. Alternatively, layer 40 can be polysilicon doped to have the first conductivity type. In the operation of the invention, the specific material from which layer 40 is comprised is dependent upon the electrical characteristics of the underlying semiconductor material and the conductivity of the channel region. As previously described, to achieve the desired result of reducing the lateral drain field, the conductivity of the material forming the gate is selected such that the work function potential at the gate edge is increased in the case of a P-type gate material and an N-type channel. Conversely, the work function potential at the gate edge can be decreased in if N-type material is used over a P-type channel. This implies that layer 40 should be a refractory metal when the underlying conductive layer is a P-type semiconductor material, and alternatively layer 40 should be a P-type material, such as P-doped polysilicon, when the underlying conductive layer is an N-type semiconductor material.

In addition to changing the electrical characteristics of the underlying conductive layer, layer 40 is also used as a sidewall spacer to complete the formation of the IT-gate. An additional layer 42 of spacer forming material is optionally deposited to overlie layer 40. Additional spacer forming layer 42 can be any material which is differentially etchable with respect to peripheral layer 34. Additional spacer forming layer 42 is preferably silicon nitride, or alternatively spacer forming layer 42 can be LTO.

Figure 8:
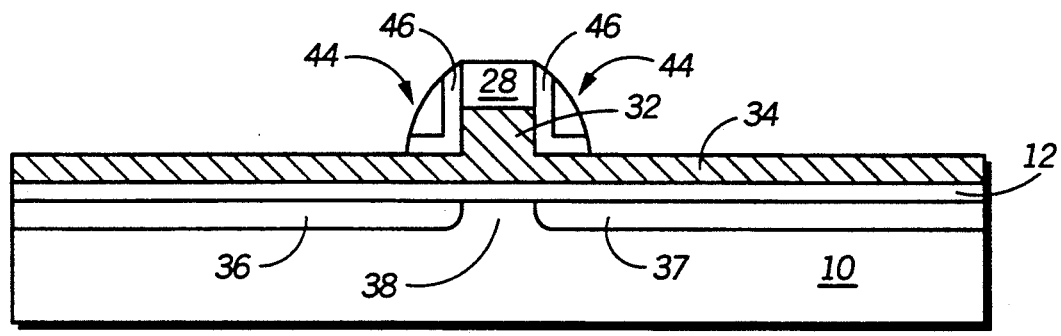

As then shown in FIG. 8, layers 40 and 42 are anisotropically etched to form a composite sidewall spacer 44 on central section 32 and buffer portion 28. In the case where a only a layer of work function adjusting material is deposited composite sidewall spacer 44 will be solely comprised of the work function adjusting material. However, in the embodiment shown in FIG. 8, layer 42 is etched to form a portion of composite sidewall spacer 44 which in turn provides an etch mask protecting an underlying portion of layer 40. The etching of layer 40 forms a Φ adjust layer 46 overlying the sides of central section 32 and a portion of peripheral region 34 adjacent to central section 32. The combined deposited thickness of layers 40 and 42 determines the thickness of composite sidewall spacer 44.

Figure 9:
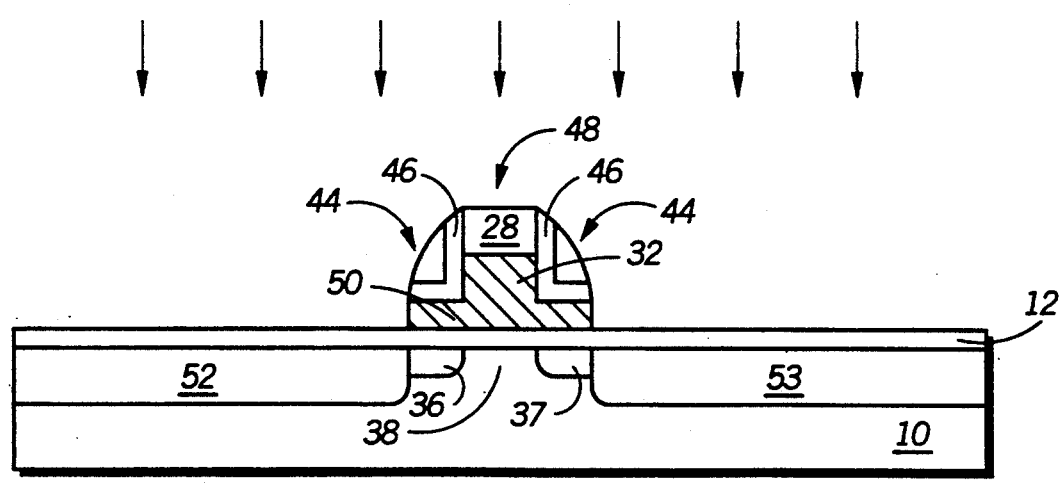

Sidewall spacer 44 is then used as an etch mask and peripheral region 34 is etched to form an IT-gate 48, as shown in FIG. 9. IT-gate 48 includes a lateral extension 50 projecting from central section 32 along gate dielectric layer 12 overlying lightly doped region 36 and 37. Work function adjust layer 46 overlies lateral extension 50 and the sides of central section 32. Depending upon the specific thickness of layer 40, additional spacer forming layer 42 may not be necessary to complete the formation of the IT-gate 48. The total thickness of the spacer determines the length of the lateral extension 50. For example, in the case where layer 40 has sufficient thickness to provide masking action during the etch which forms lateral extension 50, additional material is unnecessary to form lateral extension 50 to a desired length. Following the formation of IT-gate 48 heavily doped regions 52 and 53 of a second conductivity type are formed in substrate region 10 aligned to the edge of lateral extension 50. Preferably, heavily doped regions 52 and 53 are formed by ion implantation of conductivity determining dopant atoms using IT-gate 48 as an implant mask.

In order to activate the dopant in the source and drain regions a thermal process is carried out using a conventional thermal convective furnace process, or alternatively, radiative heating such as rapid thermal annealing. If a previous thermal cycle was not carried out, and in the case where work function adjust layer 46 is a refractory metal, the thermal process used to activate dopants in the source and drain regions will also form a silicide at the interface between gate extension 50 and work function adjust layer 46. Furthermore, in cases where gate extension 50 has a thickness of about 25 to 150 nm, substantially all of the material in gate extension 50 will be converted to a refractory metal silicide. In cases where work function adjust layer 46 is a P-doped semiconductor, the thermal cycle diffuses the dopant into gate extension 50 imparting a P-type conductivity to gate extension 50.

The structure shown in FIG. 9 is then further processed to remove buffer portion 28 and the remaining portion of layer 42 to form the device shown in FIG. 1. Alternatively, buffer portion 28 and the remaining portion of layer 42 can remain, as shown in FIG. 9, and ITLDD transistor 60 will have substantially the same functionality as previously described. In a manner consistent with the level of skill in the art to which the present invention pertains, further process steps are carried out, in accordance with the present invention, to complete the fabrication of an integrated circuit device. Depending upon the particular configuration and sequence of photomasking layers, the process of the present invention can be used as an integral part of a complete process further employing additional process steps to fabricate an MOS device such as a DRAM, SRAM, data processor device, Bi-CMOS device and the like.

Thus it is apparent that there has been provided, in accordance with the invention, a semiconductor device having an ITLDD structure which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the work function adjusted gate can be formed from a composite material such as gallium-arsenide, indium phosphide and the like, and the transistor so formed be part of a III-IV semiconductor device. It is therefore intended to include within the invention all such variations and modifications as fall within the scope of the appended claims and equivalents thereof.

We claim:

1. A semiconductor device comprising:
    a semiconductor substrate of a first conductivity type having a gate dielectric layer thereon;
    first and second lightly doped regions of a second conductivity type in the substrate spaced apart by a channel region;
    a monolithic inverse-T gate electrode formed on the gate dielectric layer overlying the first and second lightly doped regions and the channel region, the inverse-T gate having a relatively thick central section and relatively thin lateral extensions projecting from the central portion along the gate dielectric layer;

a work function adjust layer overlying and in intimate contact with at least the lateral extensions of the inverse-T gate; and heavily doped source and drain regions of the second conductivity type formed in the substrate adjacent to the first and second lightly doped regions and aligned to the edge of the gate extensions.

2. The device of claim 1 wherein the gate electrode material is polycrystalline silicon and the work function adjust layer is a refractory metal selected from the group consisting of titanium, molybdenum, tungsten and cobalt.

3. The device of claim 1 wherein the gate electrode material is N-doped polycrystalline silicon and the work function adjust layer is P-doped polycrystalline silicon.

4. An inverse-T gate electrode having a variable work function comprising:

a semiconductor substrate having a surface;

a monolithic semiconductor body overlying the surface having a relatively thick central portion and relatively thin lateral extensions projecting from the central portion along the surface; and a work function adjusting material overlying and in intimate contact with at least the extensions wherein the work function adjusting material changes the energy levels in the lateral extensions relative to the central portion of the semiconductor body.

5. The inverse-T gate electrode of claim 4 wherein the semiconductor body is polycrystalline silicon and the work function adjusting material is a refractory metal selected from the group consisting of titanium, molybdenum, tungsten and cobalt.

6. The inverse-T gate electrode of claim 4 wherein the semiconductor body is N-doped polycrystalline silicon and the work function adjusting material is P-doped polycrystalline silicon.

7. An inverse-T, lightly-doped drain semiconductor device comprising:

a P-type semiconductor substrate having a gate dielectric layer thereon;

a monolithic, polysilicon inverse-T gate electrode overlying the dielectric layer having a relatively thick central portion and a relatively thin peripheral portion;

a first vertical wall surface extending from the upper surface of the central portion to the upper surface of the peripheral portion;

a second vertical wall surface extending from the upper surface of the peripheral portion to the gate dielectric layer;

a work function adjusting material selected from the group consisting of P-type polycrystalline silicon, titanium, molybdenum, tungsten and cobalt overlying the first vertical wall surface and the upper surface of the peripheral portion;

a spacer forming material selected from the group consisting of silicon dioxide and silicon nitride overlying the work function adjusting material;

first and second lightly doped N-type regions in the substrate aligned to first vertical wall surface of the inverse-T gate electrode separated by a channel region underlying the central portion; and first and second heavily doped N-type regions in the substrate aligned to the second vertical wall surface of the inverse-T gate electrode and adjacent to the first and second lightly doped regions respectively.

* * * * *